United States Patent
Nedovic (10) Patent No.: US 8,258,887 B1
(45) Date of Patent: Sep. 4, 2012

(54) DELAY-COUPLED LCVCO

(75) Inventor: Nikola Nedovic, San Jose, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/093,564

(22) Filed: Apr. 25, 2011

(51) Int. Cl.
*H03B 5/08* (2006.01)

(52) U.S. Cl. ........... 331/167; 331/2; 331/46; 331/116 R; 331/116 FE; 327/238; 327/244; 455/260; 375/271

(58) Field of Classification Search ............... 331/2, 46, 331/45; 332/103; 327/238, 244; 455/260; 375/271
See application file for complete search history.

(56) References Cited

U.S. PATENT DOCUMENTS

| | | | | |
|---|---|---|---|---|
| 5,939,951 | A * | 8/1999 | Bateman et al. | 332/103 |
| 6,831,497 | B2 * | 12/2004 | Koh et al. | 327/254 |
| 6,982,592 | B2 * | 1/2006 | Petrovic et al. | 329/323 |

OTHER PUBLICATIONS

Mirzaei, Ahmad, "The Quadrature LC Oscillator: A Complete Portrait Based on Injection Locking," *IEEE Journal of Solid-State Circuits*, 42:9, Sep. 2007.
Hamel, John S., "LC Tank Voltage Controlled Oscillator Tutorial," Presented to the UW ASIC Analog Group, edited by Ryan Norris, downloaded from http://www.actel.kr/_hdl/2/-asic.uwaterloo.ca/files/vcotut.pdf on Aug. 6, 2010, 2005.
Nedovic, Nikola et al., "A 2 x 22Gb/s SFI5.2 CDR/Deserializer in 65nm CMOS Technology," *Symposium on VLSI Circuits Digest of Technical Papers*, 2009.

* cited by examiner

*Primary Examiner* — Arnold Kinkead
(74) *Attorney, Agent, or Firm* — Baker Botts L.L.P.

(57) ABSTRACT

In one embodiment, a circuit comprises a first inductor-capacitor based voltage-controlled oscillator (LCVCO) generating a first periodic signal with a first frequency and a first phase and a second LCVCO generating a second periodic signal with a second frequency and a second phase, and the second phase is offset relative to the first phase by a 90 degrees offset.

19 Claims, 9 Drawing Sheets

DELAY-COUPLED LCVCO

TECHNICAL FIELD

The present disclosure relates generally to generating multi-phase signals.

BACKGROUND

Multiple clock signals generated with different respective phases but with the same shared frequency are often collectively referred to as a multi-phase signal. One particular example of a multi-phase signal is a multi-phase clock (or multi-phase clock signal). Multi-phase clocks are used in many applications to improve, for example, the accuracy of timing while maintaining the same frequency. As an example, the nominal phase offset between each of the four constituent clock signals of a multi-phase quadrature clock is 90 degrees; that is, a first one of the clock signals of the multi-phase quadrature clock is nominally taken to have zero degree phase, the second one of the clock signals of the multi-phase quadrature clock has a nominal 90 degree phase offset relative to the first one of the clock signals, the third one of the clock signals of the multi-phase quadrature clock has a nominal 90 degree phase offset relative to the second one of the clock signals (and hence a 180 degree phase offset relative to the first one of the clock signals), and the fourth one of the clock signals of the multi-phase quadrature clock has a nominal 90 degree phase offset relative to the third one of the clock signals (and hence a 270 degree phase offset relative to the first one of the clock signals). As another example, the phase offset between the two clock signals of a multi-phase differential clock is nominally 180 degrees.

A clock and data recovery (CDR) circuit or system is one common example of a circuit or system that generally uses a multi-phase clock to avoid operating at the frequency of the incoming data. That is, by sampling the incoming data using a multi-phase clock, the frequency of the clock doesn't have to match the frequency of the incoming data (e.g., each constituent clock signal of an n-phase clock may have $1/n^{th}$ or less the frequency of the incoming data). CDR circuits are generally used to sample an incoming data signal, extract the clock from the incoming data signal, and retime the sampled data. A phase-locked loop (PLL)-based CDR circuit is a conventional type of CDR circuit. By way of example, in a conventional PLL-based CDR, a phase detector compares the phase between input data bits from a serial input data stream and a clock signal from a voltage-controlled oscillator (VCO). In response to the phase difference between the input data and the clock, the phase detector generates signals that will ultimately result in an increase (e.g., as a result of an "UP" signal) or decrease (e.g., as a result of a "DN" signal) of the frequency or phase of the clock signal generated by the VCO so as to match the frequency of the incoming data. A charge pump drives a current to or from a loop filter according to the UP and DN signals, respectively. The loop filter generates a control voltage $V_{CTRL}$ for the VCO based on the current driven to or from the loop filter based on the UP and DN signals. The loop just described serves as a feedback control system that tracks the phase of input data stream with the phase of the clock that the loop generates. The dynamics of the loop are generally determined by the open loop gain and the location of open loop zeroes and poles (predominantly in the loop filter).

In high-performance applications, a VCO is typically built around an LC tank that consists of an inductor and a capacitor arranged in a parallel configuration. This type of VCO is commonly referred to as an LCVCO. LCVCOs can be configured for fixed frequency and variable frequency operation, the latter being achieved with the use of a varactor (a variable capacitor). LCVCOs generally include two main stages: a gain stage and the LC tank. Furthermore, LCVCOs generally have excellent phase noise and jitter performance at high frequencies.

However, one problem with generating multiple clock phases with an LCVCO is that one LC tank can generate only two complementary clock phases (e.g., zero and 180 degrees), and hence, two LC tanks are typically coupled to one another to produce a desired phase shift in the clock signals generated by one of the two coupled LCVCOs (e.g., 90 degrees in the case of a quadrature clock). One example of an application in which a non-90 degree phase offset is desired or required is in a phase adjust specification in an optical communication system in which the data sampling phases are required to be user-controlled with respect to the center of the eye of the data.

DESCRIPTION OF EXAMPLE EMBODIMENTS

Particular embodiments relate to an electronic circuit, device, apparatus, system, or method for generating a multi-phase periodic signal, and more particularly, a multi-phase clock signal for use in various signal communication systems. As an example, particular embodiments relate to an electronic circuit, device, apparatus, system, or method for generating a multi-phase clock signal for use in a CDR circuit or system. In particular embodiments, the circuit, device, apparatus, system, or method is implemented by coupling two or more multi-phase generating LCVCOs. Particular embodiments may be configured to allow for a controllable or configurable phase offset between multi-phase generating LCVCOs. Furthermore, particular embodiments compensate for the mismatch-induced or coupling-induced phase errors in multi-phase generating LCVCOs. Particular embodiments may be utilized in high speed circuits or communication systems (e.g., having clock frequencies or data bit rates at or exceeding 2.5, 5, 10 or 20 Gigabits per second (Gb/s)).

In the following description, particular embodiments are described with reference to an implementation that generates a four-phase clock signal for use in a signal communication system. However, other embodiments may be applicable in generating other multi-phase signals including multi-phase clock signals having more than four constituent clock signals and respective phases, multi-phase clock signals whose constituent clock signals have respective phases that are offset relative to each other in increments of greater or less than 90 degrees (i.e., non-quadrature clock signals), and other periodic signals in general. Furthermore, as used herein, "or" may imply "and" as well as "or;" that is, "or" does not necessarily preclude "and," unless explicitly stated or implicitly implied.

Figure 1:
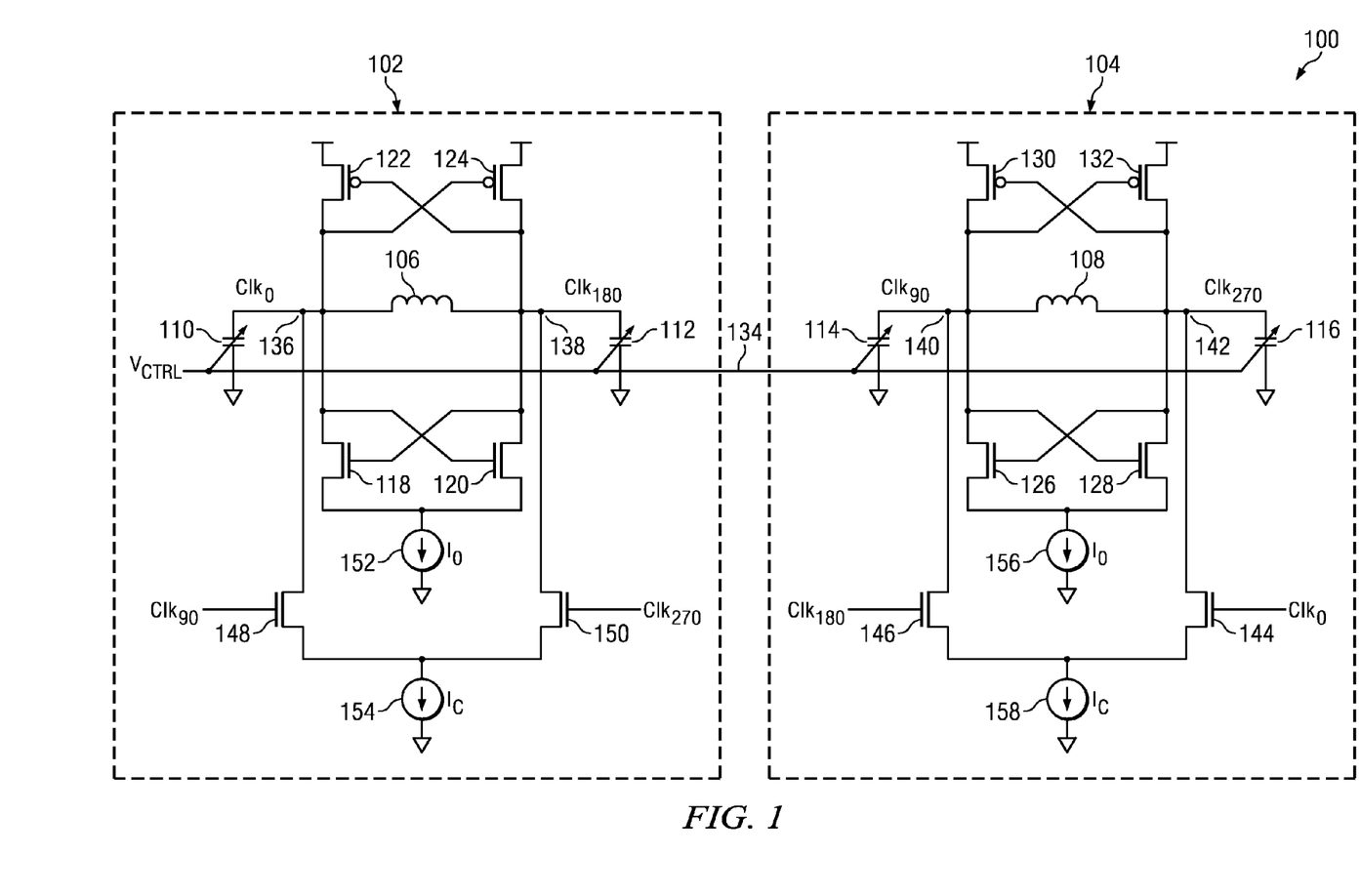
FIG. 1 illustrates an example circuit, apparatus, or system for generating a multi-phase quadrature clock that includes two coupled LCVCOs.

As described above, one problem with generating multiple clock phases with a single LCVCO is that one LC tank generates only two complementary clock phases (e.g., zero and 180 degrees), and hence, two LC tanks are typically coupled to one another to produce a desired phase shift (e.g., 90 degrees) so that, for example, a four-phase quadrature clock may be generated. FIG. 1 illustrates an example circuit or system 100 for generating a multi-phase quadrature clock based on a control voltage $V_{CTRL}$, which, in one example application, is received from a loop filter in a CDR circuit such as that described above. Circuit 100 includes a first LCVCO 102 and a second LCVCO 104. The first LCVCO 102 includes a first LC tank that includes inductor 106 and varactors 110 and 112 (a varactor is a variable capacitor, typically, a voltage-controlled capacitor). Similarly, the second LCVCO 104 includes a second LC tank that includes inductor 108 and varactors 114 and 116. LCVCO 102 further includes bias current sources 152 and 154 producing bias currents $I_O$ and $I_C$, respectively, while LCVCO 104 further includes bias current sources 156 and 158 producing bias currents $I_O$ and $I_C$, respectively. Each of the first and second LCVCOs 102 and 104 operate, nominally, at the same frequency but resonate at different phases. Each of the first and second LCVCOs 102 and 104 essentially includes a differential pair, or pair of differential pairs, that has/have been cross-coupled in a positive feedback configuration.

More particularly, the first LCVCO 102 includes a first differential pair that includes a first transistor 118 whose input (e.g., gate voltage) is electrically connected to the output (e.g., drain) of a second transistor 120 of the first differential pair. Additionally, the input (e.g., gate voltage) of the second transistor 120 is electrically connected to the output (e.g., drain) of the first transistor 118 of the first differential pair. The first LCVCO 102 also includes a second differential pair that includes a first transistor 122 whose input (e.g., gate voltage) is electrically connected to the output (e.g., source) of a second transistor 124 of the second differential pair, which is also electrically connected to the output of the second transistor 120 of the first differential pair such that these outputs share a common voltage which is then output to output node 138. Additionally, the input (e.g., gate voltage) of the second transistor 124 is electrically connected to the output (e.g., source) of the first transistor 122 of the second differential pair, which is also electrically connected to the output of the first transistor 118 of the first differential pair such that these outputs share a common voltage which is output to output node 136. The inductor 106 is connected between output nodes 136 and 138.

Similarly, the second LCVCO 104 includes a first differential pair that includes a first transistor 126 whose input is electrically connected to the output of a second transistor 128 of the first differential pair. Additionally, the input of the second transistor 128 is electrically connected to the output of the first transistor 126 of the first differential pair. The second LCVCO 104 also includes a second differential pair that includes a first transistor 130 whose input is electrically connected to the output of a second transistor 132 of the second differential pair, which is also electrically connected to the output of the second transistor 128 of the first differential pair such that these outputs share a common voltage which is then output to output node 142. Additionally, the input of the second transistor 132 is electrically connected to the output of the first transistor 130 of the second differential pair, which is also electrically connected to the output of the first transistor 126 of the first differential pair such that these outputs share a common voltage which is output to output node 140. The inductor 108 is connected between output nodes 140 and 142. In the illustrated implementation, each of the transistors 118, 120, 126, and 128, as well as transistors 144, 146, 148, and 150 described below, is a metal-oxide-semiconductor field-effect transistor (MOSFET), and more particularly, an n-channel MOSFET (nMOSFET), while each of transistors 122, 124, 130, and 132 is a p-channel MOSFET (pMOSFET).

Circuit 100 oscillates in quadrature, nominally, due to the symmetry of the constituent LCVCOs 102 and 104, and thus, any mismatches in the components of the two LCVCOs 102 and 104 may skew the desired phase offset (90 degrees) between the two LC tanks in the respective LCVCOs 102 and 104. In particular, LCVCO 102 oscillates at a frequency $\omega_{osc}$ and outputs a first clock signal $Clk_0$ on output node 136 at a clock frequency $f_{clk}$ (where $\omega_{osc}=2\pi*f_{clk}$) having a nominal phase of zero degrees and a second clock signal $Clk_{180}$ on output node 138 at the clock frequency $f_{clk}$ having a nominal phase of 180 degrees relative to $Clk_0$. Similarly, LCVCO 104 oscillates nominally at the frequency $\omega_{osc}$ and outputs a third clock signal $Clk_{90}$ on output node 140 at the clock frequency $f_{clk}$ having a nominal phase of 90 degrees relative to $Clk_0$ and a fourth clock signal $Clk_{270}$ on output node 142 at the clock frequency $f_{clk}$ having a nominal phase of 270 degrees relative to $Clk_0$. Collectively, the clock signals $Clk_0$, $Clk_{90}$, $Clk_{180}$, and $Clk_{270}$ constitute a four-phase quadrature clock under ideal operation, conditions, and construction. As FIG. 1 illustrates, clock signals $Clk_0$ and $Clk_{180}$ output from LCVCO 102 are routed to the inputs (e.g., gates) of transistors 144 and 146, respectively, of LCVCO 104. Similarly, clock signals $Clk_{90}$ and $Clk_{270}$ output from LCVCO 104 are routed to the inputs (e.g., gates) of transistors 148 and 150, respectively, of LCVCO 102. Additionally, the first and second LCVCOs 102 and 104 are further coupled by common node or trace 134.

Figure 2A:
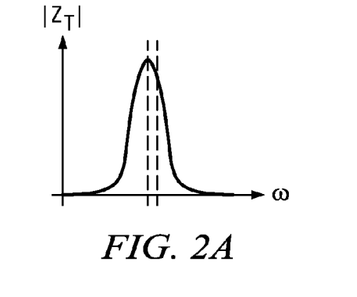
FIG. 2A illustrates the magnitude of the impedance of an example LC tank of one of the LCVCOs of FIG. 1 as a function of the clock frequency at which the impedance is measured.
Figure 2B:
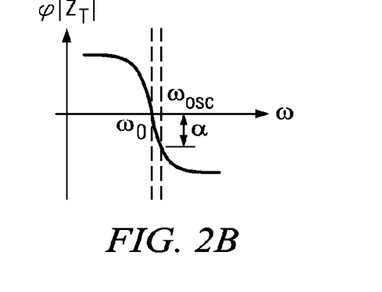
FIG. 2B illustrates the corresponding phase angle of the impedance of the example LC tank of one of the LCVCOs of FIG. 1 as a function of the clock frequency at which the impedance is measured.

FIG. 2A illustrates a plot of the magnitude of the impedance $Z_T$ of each LC tank in each of LCVCOs 102 and 104 versus the frequency of oscillation $\omega$ of each LC tank. FIG. 2B illustrates a plot of the phase angle $\phi$ of the impedance of each LC tank in each of LCVCOs 102 and 104 versus the frequency of oscillation $\omega$ of each LC tank, where $\omega_{osc}$ represents the actual frequency of oscillation of each LC tank. As shown in FIGS. 2A and 2B, the coupling between the first and second LCVCOs 102 and 104 causes a "strain" in the respective LC tanks in that each of the LC tanks in each of LCVCOs 102 and 104 oscillate at a frequency $\omega_{osc}$ that is different than the resonant frequency $\omega_0$ of each LC tank. As a result, the effective quality factor Q of each of the LC tanks in each of LCVCOs 102 and 104 decreases.

Figure 2C:
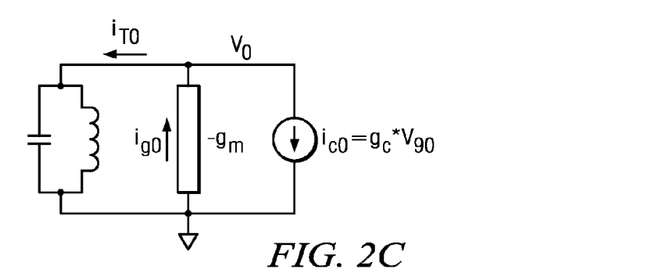
FIG. 2C illustrates an example equivalent circuit representation of one of the LCVCOs of FIG. 1.
Figure 2D:
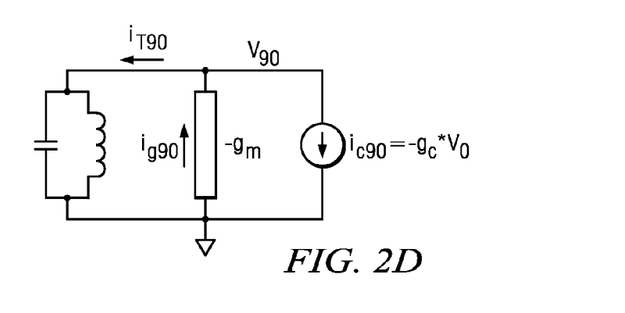
FIG. 2D illustrates an example equivalent circuit representation of the other one of the LCVCOs of FIG. 1.
Figure 2E:
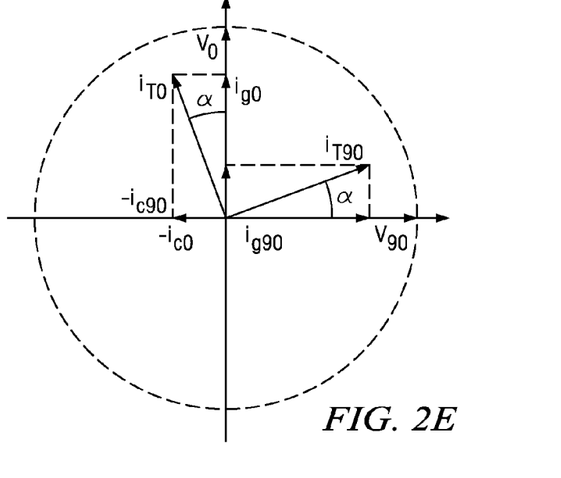
FIG. 2E illustrates an example of the phase and magnitude relationships between the currents and voltages in the LC tanks of the two coupled LCVCOs of FIG. 1.

FIGS. 2C and 2D illustrate equivalent circuit representations characterizing the behavior of LCVCOs 102 and 104, respectively, while FIG. 2E illustrates a phasor diagram of the voltages and currents of circuit 100. More particularly, FIG. 2E illustrates an example of the phase and magnitude relationships between the currents and voltages in the LC tanks of the two coupled LCVCOs of FIG. 1 showing that the currents do not have the same phases as the voltages, which indicates that the LC tanks do not operate at $\omega_0$, but at $\omega_{osc}$. In FIGS. 2C, 2D, and 2E, $i_{T0}$ is the current of the LC tank of LCVCO 102 resulting from the inductance from inductor 106 and all capacitance at nodes 136 and 138, including the varactors 110 and 112, $i_{T90}$ is the current of the LC tank of LCVCO 104 resulting from the inductance of inductor 108 and all capacitance at nodes 140 and 142, including the varactors 114 and 116, $V_0$ is the differential voltage between nodes 136 and 138 ($Clk_0$ and $Clk_{180}$) of LCVCO 102, $V_{90}$ is the differential voltage between nodes 140 and 142 ($Clk_{90}$ and $Clk_{270}$) of LCVCO 104, $i_{g0}$ is the current difference between the currents of transistors 118 and 120 of LCVCO 102, $i_{g90}$ is the current difference between the currents of transistors 126 and 128 of LCVCO 104, $g_m$ is the transconductance (which depends on $I_0$ and $I_C$) of the first differential pairs of LCVCOs 102 and 104 (where again the first differential pair of LCVCO 102 is formed by the coupled transistors 118 and 120 and the first differential pair of LCVCO 104 is formed by the coupled transistors 126 and 128), $i_{c0}$ is the current difference between the currents of the transistors 148 and 150 of LCVCO 102, $i_{c90}$ is the current difference between the currents of the transistors 146 and 144 of LCVCO 104, and $g_c$ is the transconductance (which depends on $I_0$ and $I_C$) of third differential pairs of LCVCOs 102 and 104 (where the third differential pair of LCVCO 102 is formed by the coupled transistors 148 and 150 and the third differential pair of LCVCO 104 is formed by the coupled transistors 144 and 146).

The noise properties of the coupled first and second LCVCOs 102 and 104 are worse than those of a comparable single uncoupled LCVCO. Furthermore, circuit 100 has higher sensitivity to ground and power supply noise due to the dependence of the oscillating frequency $\omega$ on the magnitude of the bias currents $I_0$ and $I_C$. Moreover, any component or bias current mismatch, or substrate or magnetic coupling between inductors 106 and 108, may result in phase error or skew between the LC tanks, and hence, the clock signals $Clk_0$, $Clk_{90}$, $Clk_{180}$, and $Clk_{270}$ they output. Another disadvantage of circuit 100 is that the circuit topology doesn't allow for a controllable phase offset between the clock signals $Clk_0$, $Clk_{90}$, $Clk_{180}$, and $Clk_{270}$; that is, the phases of the clock signals $Clk_0$, $Clk_{90}$, $Clk_{180}$, and $Clk_{270}$ are offset by fixed amounts, and in this particular example, in incremental offsets of nominally 90 degrees.

Figure 3:
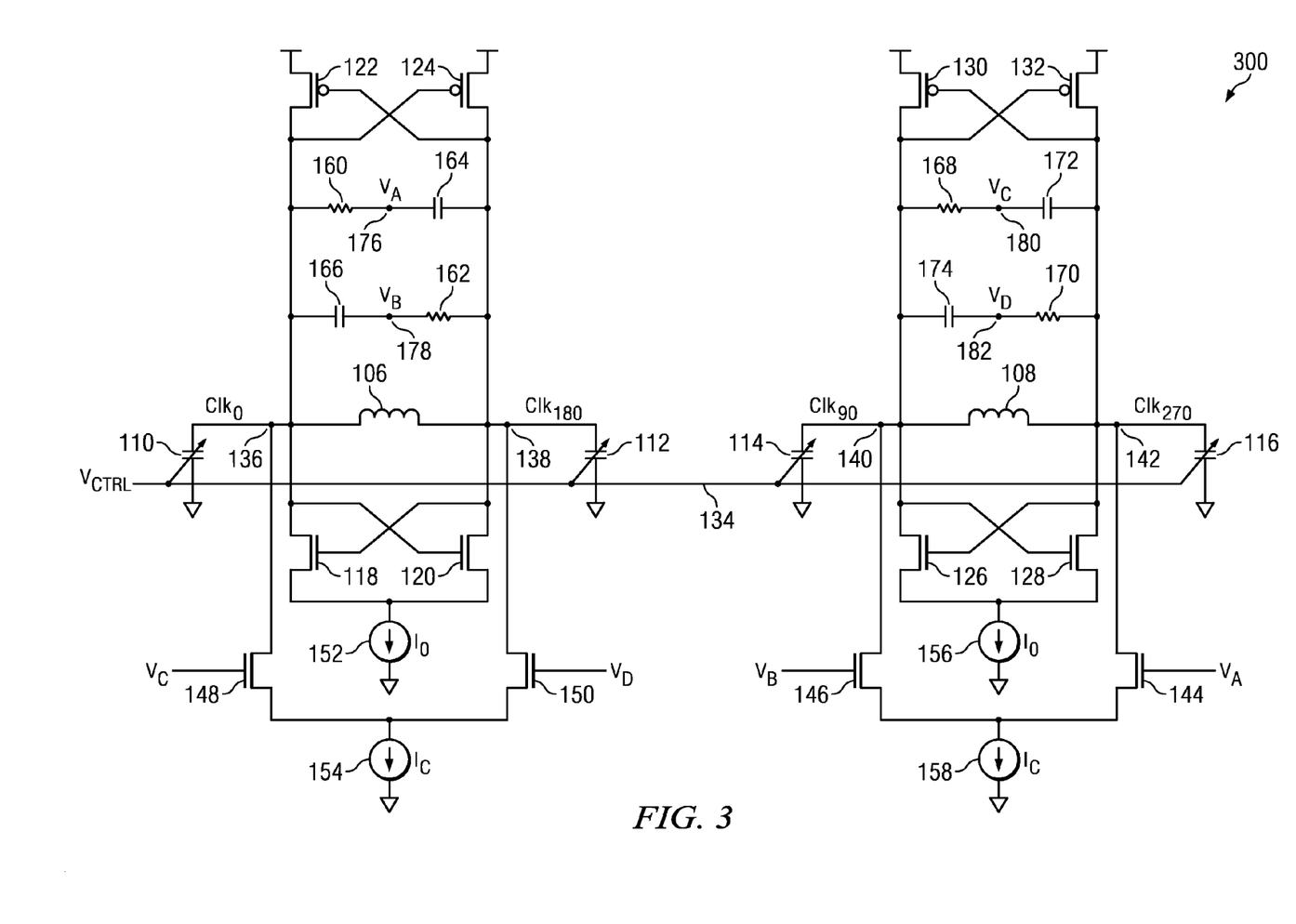
FIG. 3 illustrates an example circuit for generating a multi-phase quadrature clock that includes two coupled LCVCOs that each include a passive RC filter.

Conventional solutions or improvements to circuit 100 and those like it involve inserting passive circuits, typically an all-pass RC filter, prior to coupling, an example of which FIG. 3 illustrates. More particularly, FIG. 3 illustrates a circuit 300 in which all-pass RC filters are coupled between the output nodes of each of LCVCOs 102 and 104; that is between output nodes 136 and 138 of LCVCO 102 and between output nodes 140 and 142 of LCVCO 104. More specifically, in FIG. 3, LCVCO 102 includes an RC filter implemented with resistors 160 and 162 and capacitors 164 and 166 connected as FIG. 3 illustrates. Similarly, LCVCO 104 includes an RC filter implemented with resistors 168 and 170 and capacitors 172 and 174 connected as FIG. 3 illustrates. The resultant voltage signals $V_A$, $V_B$, $V_C$, and $V_D$, produced on nodes 176, 178, 180, and 182, respectively, are then routed to the inputs (e.g., gates) of transistors 144, 146, 148, and 150, respectively, further coupling the two LCVCOs 102 and 104. With proper values of the components (e.g., the resistance and capacitance values of the resistors and capacitors 160, 162, 164, 166, 168, 170, 172, 174) of the all-pass filters in LCVCOs 102 and 104, the respective phase-shifted coupling voltage signals $V_A/V_B$ and $V_C/V_D$ are in phase with the respective LC tank voltage signals $Clk_{90}/Clk_{270}$ (generated by LCVCO 104) and $Clk_0/Clk_{180}$ (generated by LCVCO 102) However, as with circuit 100 of FIG. 1, circuit 300 does not include any means of exerting a controllable phase shift between the LC tanks of the two LCVCOs 102 and 104 other than 90 degrees. Furthermore, circuit 300 does not include any means for correcting for a phase error caused by an undesired tank coupling between LCVCOs 102 and 104 or component mismatch.

Figure 4:
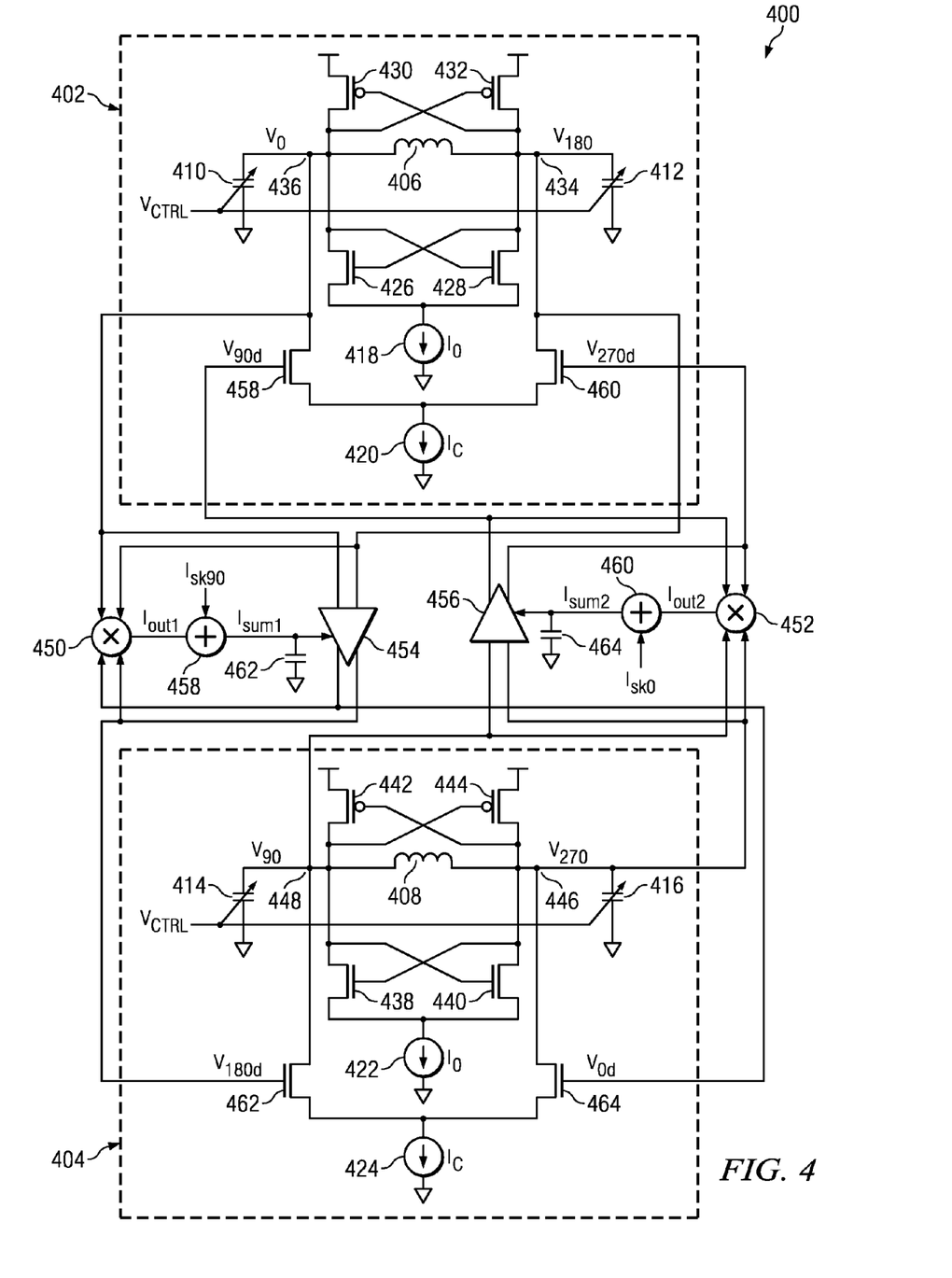
FIG. 4 illustrates an example circuit for generating a multi-phase clock that includes two LCVCOs, two phase detectors, and two delay blocks.

FIG. 4 illustrates an example circuit 400 in accordance with particular embodiments for generating a multi-phase periodic signal, and more particularly, a multi-phase clock signal. In particular embodiments, circuit 400 may be configured to allow for a controllable or configurable phase offset between multi-phase generating LCVCOs. Furthermore, particular embodiments compensate for the mismatch-induced or coupling-induced phase errors in multi-phase generating LCVCOs. In particular embodiments, circuit 400 includes a first LCVCO 402 and a second LCVCO 404. In particular embodiments, the first LCVCO 402 includes a first LC tank that includes inductor 406 and varactors 410 and 412. Similarly, the second LCVCO 404 includes a second LC tank that includes inductor 408 and varactors 414 and 416. LCVCO 402 further includes bias current sources 418 and 420 producing bias currents $I_0$ and $I_C$, respectively, while LCVCO 404 further includes bias current sources 422 and 424 producing bias currents $I_0$ and $I_C$, respectively. In particular embodiments, each of the first and second LCVCOs 402 and 404 operate, nominally, at the same frequency but resonate at different phases. Each of the first and second LCVCOs 402 and 404 includes an NMOS differential pair and a PMOS pair. In one embodiment, the PMOS pair may be a differential pair, but in the embodiment illustrated in FIG. 4, it is not a differential pair but implemented as a set of cross-coupled transistors.

In one example embodiment, the first LCVCO 402 includes a first NMOS differential pair that includes a first transistor 426 whose input (e.g., gate voltage) is electrically connected to the output (e.g., drain) of a second transistor 428 of the first differential pair. Additionally, the input (e.g., gate voltage) of the second transistor 428 is electrically connected to the output (e.g., drain) of the first transistor 426 of the first differential pair. The first LCVCO 402 may also include a second PMOS cross-coupled pair that includes a first transistor 430 whose input (e.g., gate voltage) is electrically connected to the output (e.g., source) of a second transistor 432 of the second cross-coupled pair, which is also electrically connected to the output of the second transistor 428 of the first differential pair such that these outputs share a common voltage which is then output to output node 434. Additionally, the input (e.g., gate voltage) of the second transistor 432 of the PMOS pair is electrically connected to the output (e.g., source) of the first transistor 430 of the second pair, which is also electrically connected to the output of the first transistor 426 of the first differential pair such that these outputs share a common voltage which is output to output node 436. The inductor 406 is connected between output nodes 434 and 436.

Similarly, the second LCVCO 404 may include a first NMOS differential pair that includes a first transistor 438 whose input is electrically connected to the output of a second transistor 440 of the first differential pair. Additionally, the input of the second transistor 440 is electrically connected to the output of the first transistor 438 of the first differential pair. The second LCVCO 404 may also include a second PMOS pair that includes a first transistor 442 whose input is electrically connected to the output of a second transistor 444 of the second pair, which is also electrically connected to the output of the second transistor 440 of the first differential pair such that these outputs share a common voltage which is then output to output node 446. Additionally, the input of the second transistor 444 of the second pair is electrically connected to the output of the first transistor 442 of the second pair, which is also electrically connected to the output of the first transistor 438 of the first differential pair such that these outputs share a common voltage which is output to output node 448. The inductor 408 is connected between output nodes 446 and 448. In illustrated embodiment, each of the transistors 426, 428, 438, and 440, is an nMOSFET, while each of transistors 430, 432, 442, and 444 is a pMOSFET.

In particular embodiments, the LC tanks in the LCVCOs 402 and 404 are coupled through delay blocks, which in one example embodiment have a nominal delay of 90 degrees, to modulate the resonant frequency of oscillation of each of the LC tanks to achieve a desired phase offset between the phases of the clock signals output from the two LCVCOs 402 and 404. In the illustrated embodiment, the phase offset between the phases of the first and second clock signals, $V_{90}$ and $V_{270}$, respectively, output from LCVCO 404 is 90 degrees relative to the phases of the first and second clock signals, $V_0$ and $V_{180}$, respectively, output from LCVCO 402, respectively; that is, in this example, circuit 400 oscillates in quadrature producing clock signals $V_0$, $V_{90}$, $V_{180}$, and $V_{270}$ at output nodes 436, 448, 434, and 446, respectively, and having phases of zero, 90, 180, and 270 degrees, respectively. In particular embodiments, the clock signals $V_0$ and $V_{180}$ from the first LCVCO are input to a first phase detector 450 and a first delay buffer 454. In particular embodiments, the clock signals $V_{90}$ and $V_{270}$ from the second LCVCO are input to a second phase detector 452 and a second delay buffer 456. In a particular embodiment, the first delay buffer 454 delays the clock signals $V_0$ and $V_{180}$ by a nominal 90 degree phase shift to generate the delayed versions of these signals $V_{0d}$ and $V_{180d}$ (that is, the delayed signals $V_{0d}$ and $V_{180d}$ should have phases of 90 and 270 degrees, respectively). Similarly, in a particular embodiment, the second delay buffer 456 delays the clock signals $V_{90}$ and $V_{270}$ by a nominal 90 degree phase shift to generate the delayed versions of these signals $V_{90d}$ and $V_{270d}$ (that is, the delayed signals $V_{90}$ and $V_{270d}$ should have phases of 180 and zero degrees, respectively)

In the illustrated embodiment, the first LCVCO 402 additionally includes NMOS transistors 458 and 460 whose input (gate) voltages $V_{90d}$ and $V_{270d}$, respectively, are the delayed signals received from the outputs of the second delay buffer 456. These output signals, $V_{90d}$ and $V_{270d}$, are also input to the second phase detector 452. Similarly, in the illustrated embodiment, the second LCVCO 404 additionally includes NMOS transistors 462 and 464 whose input (gate) voltages $V_{180d}$ and $V_{0d}$, respectively, are the delayed signals received from the outputs of the first delay buffer 454. These output signals, $V_{180d}$ and $V_{0d}$, are also input to the first phase detector 450.

In a particular embodiment, the first phase detector 450 detects or determines the phase offset between the nominally differential set of signals $V_0$ and $V_{180}$ output from the first LC tank and the delayed set of nominally differential signals $V_{0d}$ and $V_{180d}$ output from the first delay buffer 454. Similarly, the second phase detector 452 detects or determines the phase offset between the nominally differential set of signals $V_{90}$ and $V_{270}$ output from the second LC tank and the delayed set of nominally differential signals $V_{90d}$ and $V_{270d}$ output from the second delay buffer 456.

Figure 5A:
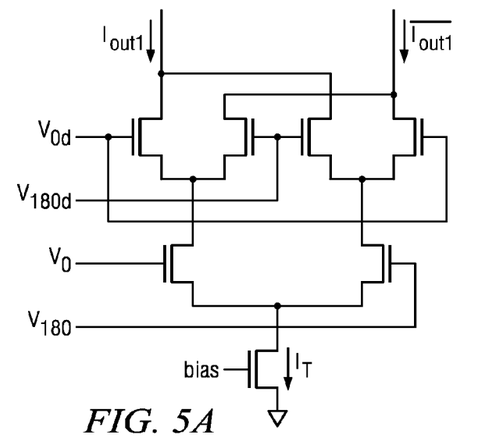
FIGS. 5A and 5B illustrate example Gilbert cells suitable for use in the phase detectors of FIG. 4.
Figure 5B:
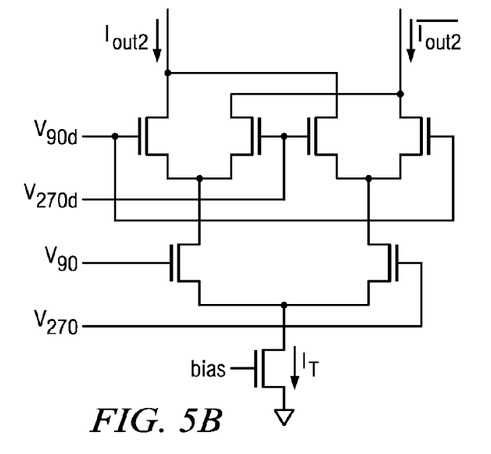
Figure 5C:
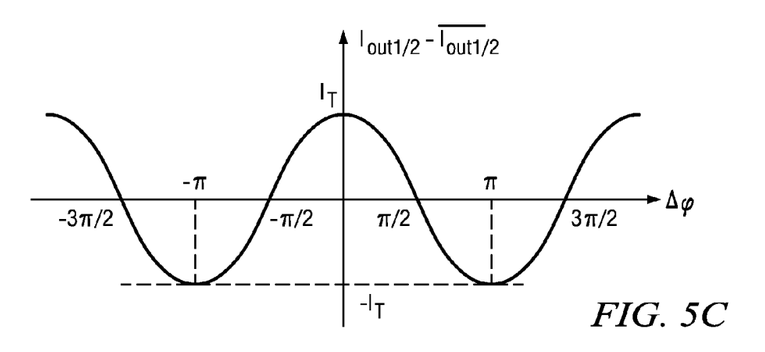
FIG. 5C illustrates an example differential signal output from a Gilbert cell of FIG. 5A or 5B as a function of phase offset between the differential signals input to the Gilbert cells of FIG. 5A or FIG. 5B, respectively.

In one example embodiment, phase detector 450 comprises a multiplying mixer cell, and more particularly, a Gilbert cell, an example of which is illustrated by way of FIG. 5A. Similarly, in one example embodiment, phase detector 452 comprises a multiplying mixer cell, and more particularly, a Gilbert cell, an example of which is illustrated by way of FIG. 5B. By way of reference, a Gilbert cell is an electronic multiplying mixer. The output current $I_{out}$ of a Gilbert cell is an accurate multiplication of the (differential) base currents of the two nominally differential sets of inputs. In the example embodiment of FIG. 5A, $V_0$ and $V_{180}$ collectively represent a first differential signal while $V_{0d}$ and $V_{180d}$ collectively represent a second differential signal. Similarly, in the example embodiment of FIG. 5B, $V_{90}$ and $V_{270}$ collectively represent a first differential signal while $V_{90d}$ and $V_{270d}$ collectively represent a second differential signal. In the example embodiments of FIGS. 5A and 5B, the second differential signal has a desired phase offset (or delay) of 90 degrees relative to the phase of the first differential signal (although in other embodiments the desired phase offset may be less than or greater than 90 degrees as desired). FIG. 5C illustrates the value of the output differential signal $I_{out1}-\overline{I_{out1}}$ (also referred to as differential signal $I_{out1}$) or $I_{out2}-\overline{I_{out2}}$ (also referred to as differential signal $I_{out2}$) output from the phase detectors 450 and 452, respectively, as a function of the phase offset $\Delta\phi$ between the respective first nominally differential input signal ($V_0$ and $V_{180}$ for phase detector 450 and $V_{90}$ and $V_{270}$ for phase detector 452) and the second nominally differential input signal ($V_{0d}$ and $V_{180d}$ for phase detector 450 and $V_{90d}$ and $V_{270d}$ for phase detector 452).

The first and second local loops (where the first local loop comprises phase detector 450 and delay buffer 454 and the second loop comprises phase detector 452 and delay buffer 456) settle (that is, the first phase detector 450 outputs zero current ($I_{out1}-\overline{I_{out1}}=0$ on average) and the second phase detector 452 outputs zero current ($I_{out2}-\overline{I_{out2}}=0$ on average)) when the delay difference between the respective first nominally differential input signal ($V_0$ and $V_{180}$ for phase detector 450 and $V_{90}$ and $V_{270}$ for phase detector 452) and the second nominally differential input signal ($V_{0d}$ and $V_{180d}$ for phase detector 450 and $V_{90d}$ and $V_{270d}$ for phase detector 452) is 90 degrees, assuming that the configurable skew control signals $I_{sk90}$ and $I_{sk0}$ are set in this example to be equal to zero. These conditions are satisfied when, for example, $V_0$, $V_{0d}$, $V_{90}$, and $V_{90d}$ are in quadrature, due to the properties of the phase detectors 450 and 452, and more specifically, because the phase detectors 450 and 452 are implemented as Gilbert cells.

In particular embodiments, the outputs of phase detectors 450 and 452, the differential signals $I_{out1}$ and $I_{out2}$, respectively, are then input to adders (or simple net summing circuits) 458 and 460, respectively. The adders 458 and 460 add the configurable baseband currents $I_{SK90}$ and $I_{SK0}$ (one or both of which may be set to zero or a configurable non-zero vale), respectively, to the output signals $I_{out1}$ and $I_{out2}$, respectively. The summed signals $I_{sum1}$ and $I_{sum2}$ output by the adders 458 and 460, respectively, are then low-pass filtered by capacitors 462 and 464, respectively, to average the respective summed signals $I_{sum1}$ and $I_{sum2}$. Of course, in alternate embodiments, other low-pass filtering or averaging schemes or techniques may be utilized. Additionally, in some alternate embodiments, the adders 458 and 460 may not be present at all or simply bypassed.

In particular embodiments, the filtered (averaged) summed signals $I_{sum1}$ and $I_{sum2}$ are then input as feedback to delay buffers 454 and 456, respectively, to adjust the delays of the delay buffers to achieve the 90 degree or other desired phase offset between the inputs to the respective delay buffer and the outputs of the respective delay buffer.

Figure 6:
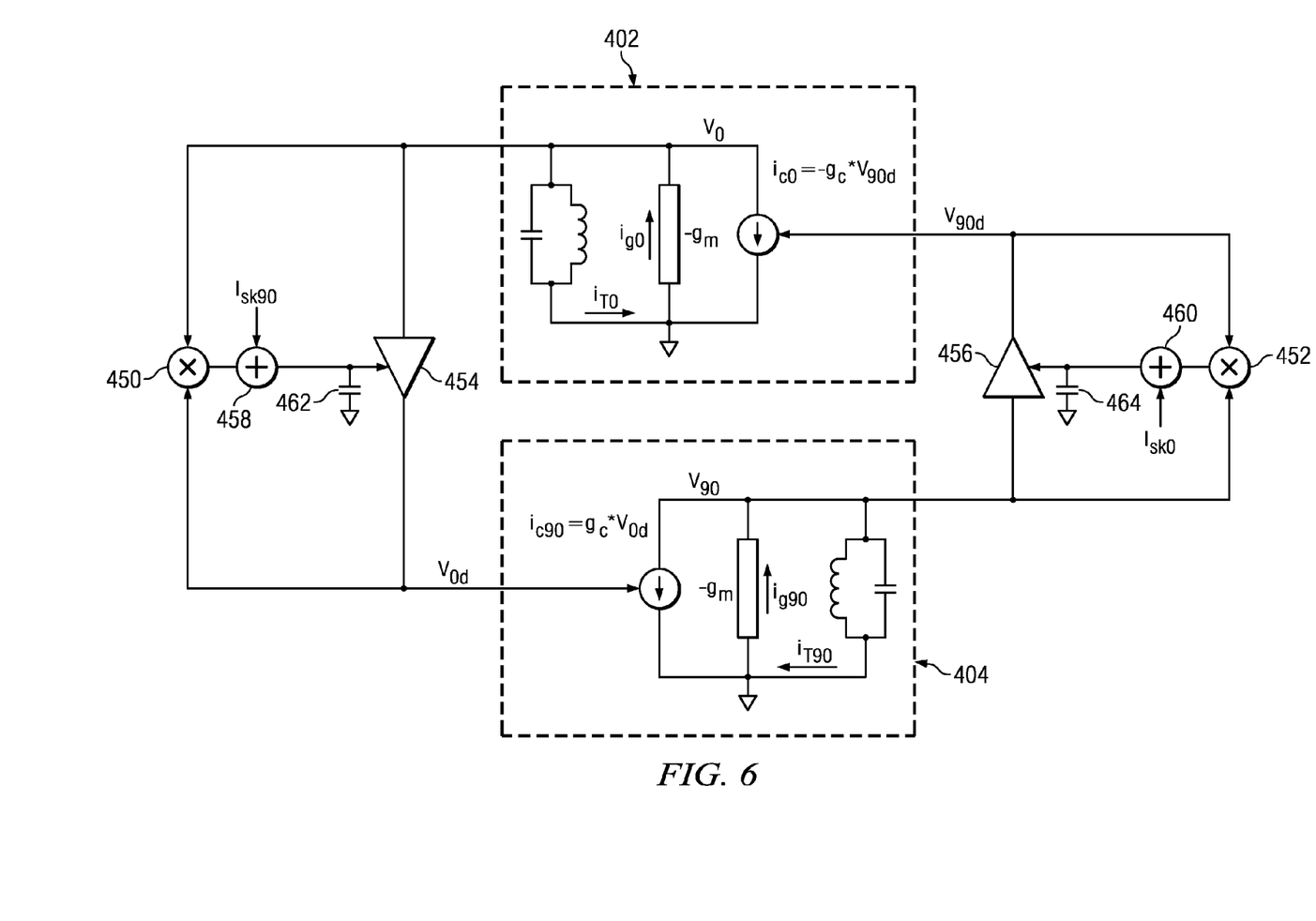
FIG. 6 illustrates an example equivalent symbol representation of the circuit of FIG. 4.

FIG. 6 illustrates an equivalent circuit representation characterizing the behavior of circuit 400 of FIG. 4. More specifically, $i_{g0}$ is the current difference between the currents through transistors 426 and 428 of LCVCO 402, $i_{g90}$ is the current difference between the currents through transistors 438 and 440 of LCVCO 404, $i_{T0}$ is the current of the LC tank of LCVCO 402 resulting from the inductance of inductor 406 and all the capacitance at nodes 436 and 434 including that from varactors 410 and 412, $i_{T90}$ is the current of the LC tank of LCVCO 404 resulting from the inductance of inductor 408 and all the capacitance at nodes 448 and 446 including that from varactors 414 and 416, $g_m$ is the transconductance (which depends on $I_0$ and $I_C$) of each of the first NMOS differential pairs; that is, the NMOS differential pair comprising coupled transistors 426 and 428 for LCVCO 402 and the NMOS differential pair comprising coupled transistors 438 and 440 for LCVCO 404, and $g_c$ is the transconductance (which depends on $I_0$ and $I_C$) of each of the second NMOS differential pairs; that is, the NMOS differential pair comprising coupled transistors 458 and 460 for LCVCO 402 and the NMOS differential pair comprising coupled transistors 462 and 464 for LCVCO 404. Additionally, $i_{c0}=-g_c*V_{90d}$ and $i_{c90}=g_c*V_{0d}$.

Figure 7A:
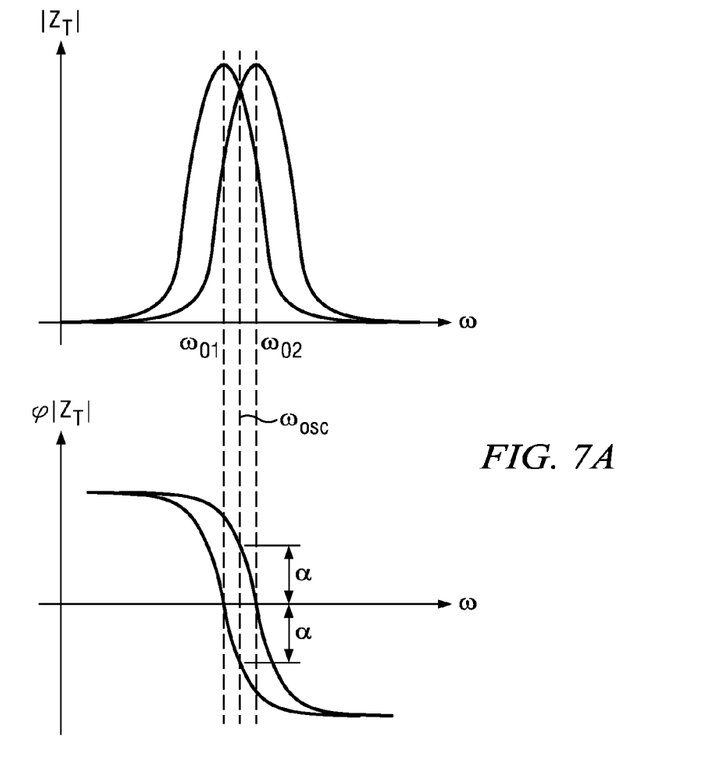
FIG. 7A illustrates the magnitude and phase angle of the impedance of an example LC tank of one of the LCVCOs of FIG. 4 as a function of the clock frequency at which the impedance is measured.
Figure 7B:
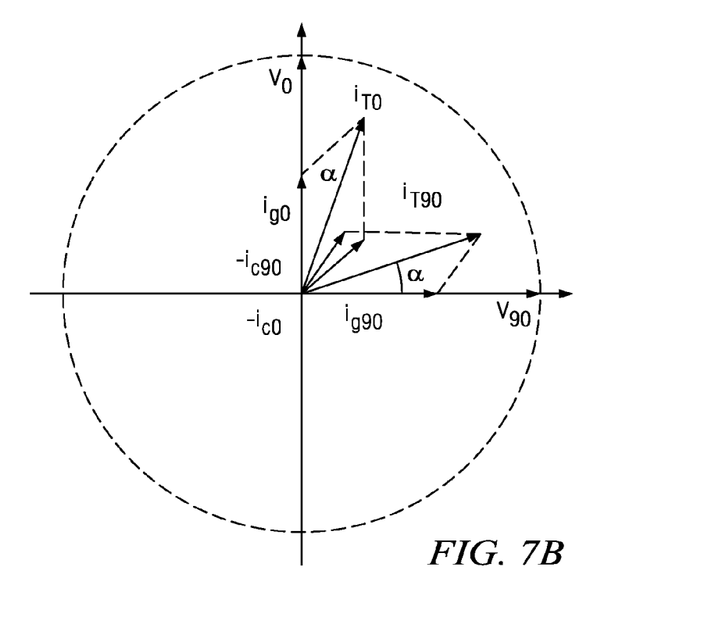
FIGS. 7B and 7C illustrate examples of the phase and magnitude relationships between the currents and voltages in the LC tanks of the two coupled LCVCOs of FIG. 4.
Figure 7C:
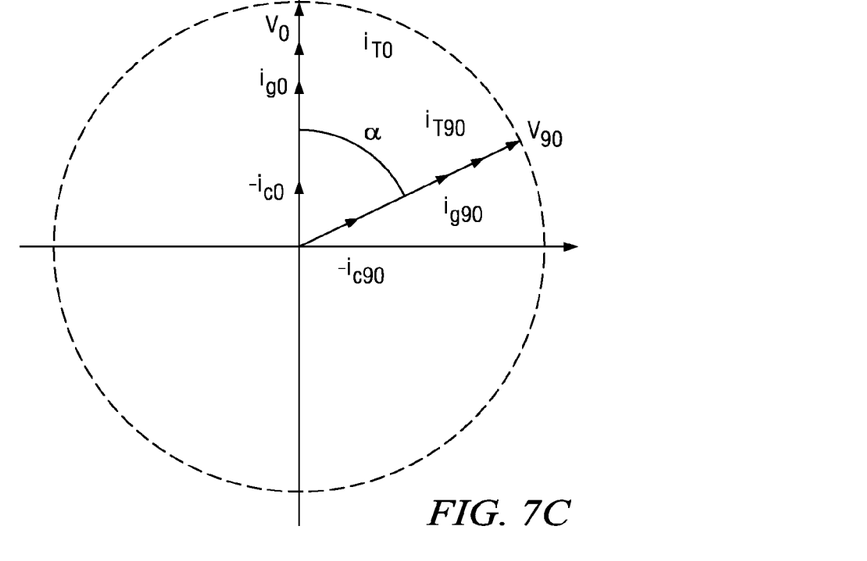

FIG. 7A illustrates a plot of the magnitude of the impedance $Z_T$ of each LC tank in each of LCVCOs 402 and 404 versus the frequency of oscillation $\omega$ of each LC tank as well as a plot of the phase angle $\phi$ of the impedance of each LC tank in each of LCVCOs 402 and 404 versus the frequency of oscillation w of each LC tank. As shown in FIG. 7A, a non-90 degree phase shift due to component mismatch or magnetic coupling between the first and second LCVCOs 402 and 404 may cause the respective LC tanks in each of the LCVCOs 402 and 404 to oscillate at different resonant frequencies $\omega_{01}$ and $\omega_{02}$, respectively. To compensate for component mismatch or magnetic coupling, the control signals $I_{sk90}$ and $I_{sk0}$ are driven to non-zero values such that the result is the desired 90 degree phase shift (or other desired phase shift) between the two LC tank voltages while also maintaining a phase a between the two LC tank voltages and the respective currents as shown in FIG. 7A and the phasor diagrams of FIGS. 7B and 7C, which illustrate the phase and magnitude relationships between the currents and voltages in the LC tanks of LCVCOs 402 and 404. In this way, the LC tanks in LCVCOs 402 and 404 both operate at $\omega_{osc}$, which may be different, as described above (due to component mismatch or magnetic coupling), than the resonant frequencies $\omega_{01}$ and $\omega_{02}$ of the LC tanks in LCVCOs 402 and 404, respectively.

Figure 8:
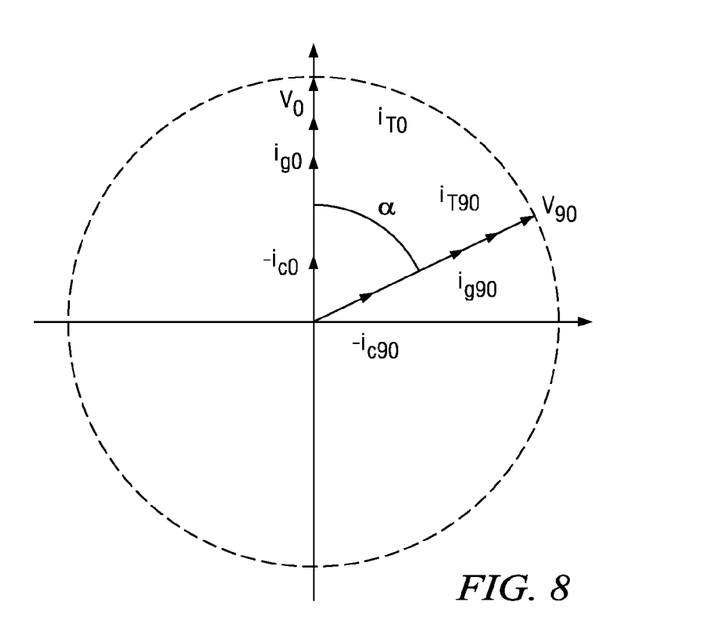
FIG. 8 illustrates an example of the phase and magnitude relationships between the currents and voltages in the LC tanks of the two coupled LCVCOs of FIG. 4 when configured for a non-90 degree phase shift.

In particular embodiments, to achieve a desired non-90 degree phase shift between the LC tanks in LCVCOs 402 and 404, the control signals $I_{sk90}$ and $I_{sk0}$ are driven to non-zero values of opposite sign and equal magnitude, an example of which is illustrated by way of the phasor diagram shown in FIG. 8. That is, by choosing (e.g., by a user) the values of the control signals $I_{sk90}$ and $I_{sk0}$, the delay of the delay buffers 454 and 456 may be configured such that the delayed signals output by the respective delay buffers 454 and 456 may have a desired non-90 degree phase offset (e.g., greater or less than 90 degrees) relative to the respective input signals to the respective delay buffers. In particular embodiments, to determine the values of the control signals $I_{sk90}$ and $I_{sk0}$ that results in the desired phase $\alpha$, circuit 400 may either need to be calibrated or some external feedback may be provided.

Thus, particular embodiments, including particular embodiments of circuit 400, allow for a controllable phase delay of multi-phase generating LCVCOs. Furthermore, particular embodiments compensate for the mismatch-induced or coupling-induced phase errors in the multi-phase generating LCVCOs. Furthermore, circuit 400 may be generalized to a greater number of LCVCOs and respective LC tanks by delay locking the individual LC tanks to the appropriate phase delays.

Figure 9:
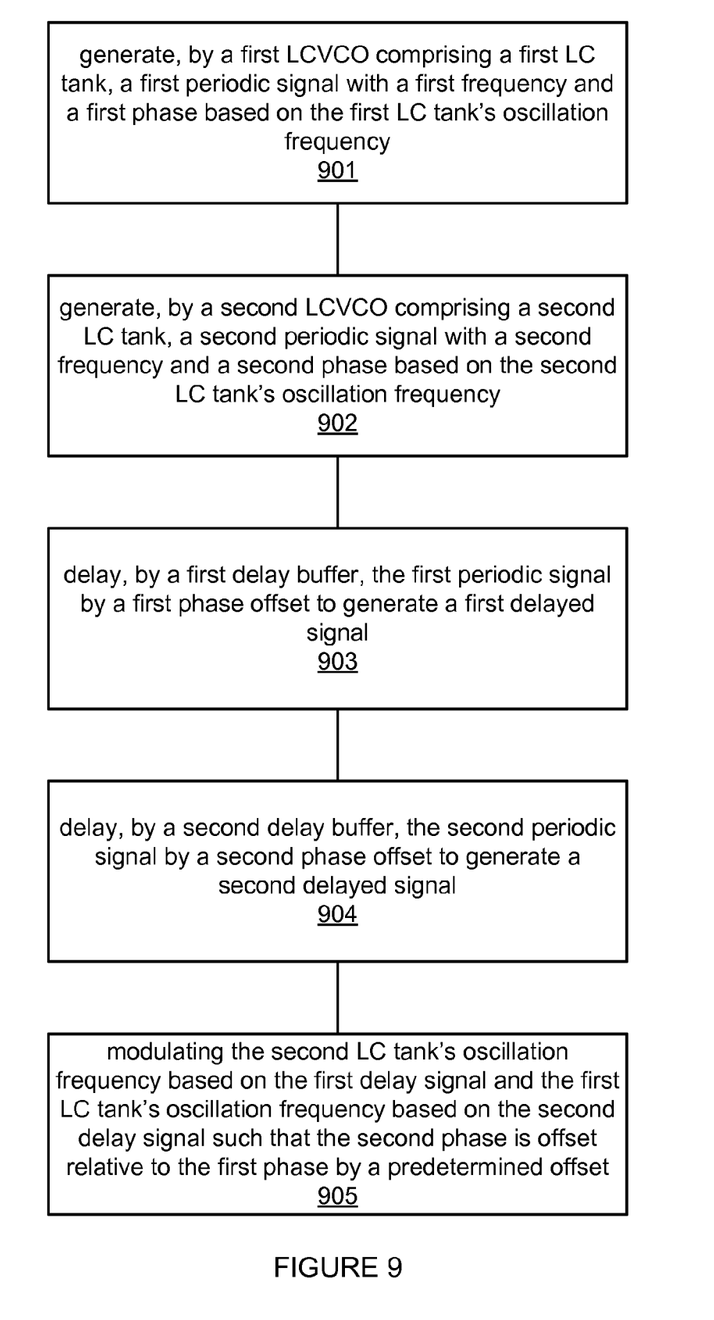
FIG. 9 illustrates an example method of generating a multi-phase clock signal.

FIG. 9 illustrates an example method of generating a multi-phase clock signal. In particular embodiments, a first LCVCO comprising a first LC tank may generate a first periodic signal with a first frequency and a first phase based on the oscillation frequency of the first LC tank (901). In particular embodiments, a second LCVCO comprising a second LC tank may generate a second periodic signal with a second frequency and a second phase based on the oscillation frequency of the second LC tank (902). In particular embodiments, a first delay buffer may delay the first periodic signal by a first phase offset to generate a first delay signal (903). In particular embodiments, a second delay buffer may delay the second periodic signal by a second phase offset to generate a second delayed signal (904). As illustrated in the example of FIG. 6, a first delay buffer 454 delays a first periodic signal from a first LCVCO 402 and transmit the first delayed signal to an input of a second LCVCO 404, and a second delay buffer 456 delays a second periodic signal from the second LCVCO 404 and transmit the second delayed signal to an input of the first LCVCO 402. In particular embodiments, the first delayed signal may modulate the oscillation frequency of the second LC tank to adjust the second frequency and second phase of the second periodic signal, and the second delayed signal may modulate the oscillation frequency of the first LC tank to adjust the first frequency and first phase of the first periodic signal (905). Additionally, in some embodiments, a first phase detector (e.g., 450 in FIG. 6) may determine the first phase offset based on the first periodic signal and the first delayed signal, and a second phase detector (e.g., 452 in FIG. 6) may determine the second phase offset based on the second periodic signal and the second delayed signal. In some embodiments, a first adder (e.g., 458 in FIG. 6) may adjust the first phase offset based on a first configurable current (e.g., $I_{sk90}$ in FIG. 6), and a second adder (e.g., 460 in FIG. 6) may adjust the second phase offset based on a second configurable current (e.g., $I_{sk0}$ in FIG. 6). In one embodiments, the first phase offset and the second phase offset may further be filtered by low-pass filters (e.g., 462 and 464 in FIG. 6).

Although the present disclosure describes and illustrates particular steps of the method or process of FIG. 9 as occurring in a particular order, the present disclosure contemplates any suitable steps of the method of FIG. 9 occurring in any suitable order as well as iteratively or on a continuous basis. Moreover, although the present disclosure describes and illustrates particular components carrying out particular steps of the method of FIG. 9, the present disclosure contemplates any suitable combination of any suitable components carrying out any suitable steps of the method of FIG. 9.

The present disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend.

The invention claimed is:

1. A method comprising:
generating, by a first inductor-capacitor based voltage-controlled oscillator (LCVCO) comprising a first LC tank, a first periodic signal having a first frequency and a first phase based on an oscillation frequency of the first LC tank;
generating, by a second LCVCO comprising a second LC tank, a second periodic signal having a second frequency and a second phase based on an oscillation frequency of the second LC tank;
delaying, by a first delay buffer, the first periodic signal by a first phase offset to generate a first delayed signal;
delaying, by a second delay buffer, the second periodic signal by a second phase offset to generate a second delayed signal; and
modulating the oscillation frequency of the second LC tank based on the first delayed signal to adjust the second frequency and second phase of the second periodic signal and the oscillation frequency of the first LC tank based on the second delayed signal to adjust the first frequency and first phase of the first periodic signal wherein the second phase is offset relative to the first phase by a predetermined offset.

2. The method of claim 1, further comprising:
determining, by a first phase detector, the first phase offset based on the first periodic signal and the first delayed signal; and
determining, by a second phase detector, the second phase offset based on the second periodic signal and the second delayed signal.

3. The method of claim 2, further comprising:
adjusting, by a first adder, the first phase offset based on a first configurable current; and
adjusting, by a second adder, the second phase offset based on a second configurable current.

4. The method of claim 1 wherein the first frequency matches the second frequency.

5. The method of claim 1, wherein:
the first periodic signal is a differential signal comprising a first first periodic signal and a second first periodic signal, the first first periodic signal and the second first periodic signal having respective phases that are offset by 180 degrees; and
the second periodic signal is a differential signal comprising a first second periodic signal and a second second periodic signal, the first second periodic signal and the second second periodic signal having respective phases that are offset by 180 degrees.

6. The method of claim 1, wherein:
the first phase offset is 90 degrees; and
the second phase offset is 90 degrees.

7. The method of claim 1, wherein the predetermined offset is 90 degrees.

8. The method of claim 3, wherein to achieve a non-90 degree predetermined phase offset, the first configurable current and second configurable current have equal magnitudes but opposite signs.

9. The method of claim 2, wherein:
the first phase detector comprises a Gilbert cell; and
the second phase detector comprises a Gilbert cell.

10. A circuit comprising:
a first inductor-capacitor based voltage-controlled oscillator (LCVCO) comprising a first LC tank, the first LCVCO being configured to generate a first periodic signal having a first frequency and a first phase based on an oscillation frequency of the first LC tank;
a second LCVCO comprising a second LC tank, the second LCVCO being configured to generate a second periodic signal having a second frequency and a second phase based on an oscillation frequency of the second LC tank;
a first delay buffer configured to delay the first periodic signal by a first phase offset to generate a first delayed signal, and modulate the oscillation frequency of the second LC tank based on the first delayed signals to adjust the second frequency and second phase of the second periodic signal; and
a second delay buffer configured to delay the second periodic signal by a second phase offset to generate a second delayed signal, and modulate the oscillation frequency of the first LC tank based on the second delayed signal to adjust the first frequency and first phase of the first periodic signal, wherein the second phase is offset relative to the first phase by a pre-determined offset.

11. The circuit of claim 10, further comprising:
a first phase detector configured to determine the first phase offset based on the first periodic signal and the first delayed signal; and
a second phase detector configured to determine the second phase offset based on the second periodic signal and the second delayed signal.

12. The circuit of claim 11, further comprising:
a first adder configured to adjust the first phase offset based on a first configurable current; and
a second adder configured to adjust the second phase offset based on a second configurable current.

13. The circuit of claim 10 wherein the first frequency matches the second frequency.

14. The circuit of claim 10, wherein:
the first periodic signal is a differential signal comprising a first first periodic signal and a second first periodic signal, the first first periodic signal and the second first periodic signal having respective phases that are offset by 180 degrees; and
the second periodic signal is a differential signal comprising a first second periodic signal and a second second periodic signal, the first second periodic signal and the second second periodic signal having respective phases that are offset by 180 degrees.

15. The circuit of claim 10, wherein:
the first phase offset is 90 degrees; and
the second phase offset is 90 degrees.

16. The circuit of claim 10, wherein the predetermined offset is 90 degrees.

17. The circuit of claim 12, wherein to achieve a non-90 degree predetermined phase offset, the first configurable current and second configurable current have equal magnitudes but opposite signs.

18. The circuit of claim 11, wherein:
the first phase detector comprises a Gilbert cell; and
the second phase detector comprises a Gilbert cell.

19. A system comprising:
means for generating a first periodic signal having a first frequency and a first phase based on an oscillation frequency of a first LC tank;

means for generating a second periodic signal having a second frequency and a second phase based on an oscillation frequency of a second LC tank;

means for delaying the first periodic signal by a first phase offset to generate a first delayed signal;

means for delaying the second periodic signal by a second phase offset to generate a second delayed signal; and means for modulating the oscillation frequency of the second LC tank based on the first delayed signal to adjust the second frequency and second phase of the second periodic signal and the oscillation frequency of the first LC tank based on the second delayed signal to adjust the first frequency and first phase of the first periodic signal wherein the second phase is offset relative to the first phase by a predetermined offset.

* * * * *